United States Patent [19]

Ceraso

[11] Patent Number: 5,647,940

[45] Date of Patent: Jul. 15, 1997

[54] PROCESS FOR AUTOMATICALLY CONNECTING A SOURCE OF ELECTRIC CURRENT AND A PILE OF PACKAGES TO MAKE PLASTIC LAMINATES WITH ENDOTHERMIC HEATING

[75] Inventor: Bruno Ceraso, Milan, Italy

[73] Assignee: Cedal S.R.L., Milan, Italy

[21] Appl. No.: 501,073

[22] PCT Filed: Mar. 31, 1993

[86] PCT No.: PCT/IT93/00029

§ 371 Date: Aug. 4, 1995

§ 102(e) Date: Aug. 4, 1995

[87] PCT Pub. No.: WO94/21459

PCT Pub. Date: Sep. 29, 1994

[30] Foreign Application Priority Data

Mar. 18, 1993 [IT] Italy .................. MI93A0514

[51] Int. Cl.$^6$ ........................ B32B 31/00
[52] U.S. Cl. .................. 156/273.9; 156/274.2; 156/379.7; 156/380.2; 156/380.6; 29/848; 219/765; 219/777
[58] Field of Search ............. 156/272.2, 273.9, 156/274.2, 379.7, 379.8, 380.2, 380.6; 29/846, 848; 219/765, 777

[56] References Cited

U.S. PATENT DOCUMENTS 4,268,338  5/1981  Peterson ................... 219/777 X
4,427,865  1/1984  Watanabe .................. 219/765

FOREIGN PATENT DOCUMENTS 2254423  7/1975  France .
2623982  6/1989  France .
 485717  5/1938  United Kingdom .
1321305  6/1973  United Kingdom .

Primary Examiner—David A. Simmons
Assistant Examiner—Paul M. Rivard
Attorney, Agent, or Firm—Michael J. Striker

[57] ABSTRACT

Process for automatic connection, at the moment of pressing, between a source (26) of electric current and the metal parts (35), connected in series, of the piles (30) of packages (31) for making plastic laminates to permit electric endothermic heating, there being placed in the pressing machines (10), at those parts which will come in contact with the ends (36,37) of the pile (30), metal contact sheets (20,21) connected to the source (26) of electric current.

10 Claims, 7 Drawing Sheets

PROCESS FOR AUTOMATICALLY CONNECTING A SOURCE OF ELECTRIC CURRENT AND A PILE OF PACKAGES TO MAKE PLASTIC LAMINATES WITH ENDOTHERMIC HEATING

BACKGROUND OF THE INVENTION

The invention concerns methods for producing plastic laminates, especially those for printed circuits.

As is widely known, plastic laminates are sheets obtained by stable association, usually made by pressing, of several layers of plastic materials on a backing of paper, fibreglass fabrics, or other kinds.

The plastic materials may be of phenol, melamine, epoxy, polyester, silicon, fluoride or others.

In the production of printed circuits a metal lamina, usually of copper, is pressed onto one or both their sides.

A pile of packages, all substantially the same, is formed each comprising a number of layers impregnated with the plastic materials, the copper lamine being placed externally. A sheet of metal, such as stainless steel, is laid between one package and another, and the pile is placed in a multi-plate press that provides heat and pressure simultaneously.

At the end of the heating cycle, which also includes a cooling stage, a compact and rigid product is formed whose single components are closely associated.

The presses suitable for such production are complex and give a low output due to their having several plates, to the need to provide heat and pressure at the same time, in precise and clearly-defined sequences, to having to provide, by conduction, even temperatures throughout the various packages in the pile of which only those at the top and bottom will be in contact with heating plates. The presence of several heating plates not only complicates the structure but also makes loading and unloading a lengthy process, also creating problems for short production runs due to difficulties over amortizing costs. In particular the penetration of heat from the plates to the piled up packages is hindered because of the distance the heat must travel to reach the innermost packages. High costs are therefore encountered both for plant and for running it, for wasted material, long processing times, all of which means an expensive product. To eliminate or reduce these drawbacks various processes have been devised all based on endothermic heating by means of electric resistances created by just those metal elements needed to form the piles of packages to make plastic laminates, when said piles are put inside presses or in autoclaves to execute the pressing process.

PCT IT92/00101 discloses a process whereby endothermic heating is obtained by forming the metal laminae from a continuous band and connecting said band, especially one of copper, to a source of electric current.

PCT IT92/00097 discloses a process in accordance with which the packages in the pile are made of a multi-composition band and therefore comprise both bands of prepreg and one or two metal bands, especially of copper. The metal bands are connected to a source of electricity. IT MI93 A 000223 discloses a process according to which the electric resistances are obtained by connecting to a source of electricity either the copper lamine or laminae of other material forming the laminates, or the sheets of steel or other metal inserted between one package and another in the pile, or else the series of lengths of electricity conductor bands, bent in a "U", whose ends are inserted between one pair of said steel sheets and the next one, connected together serpentine-wise. IT MI93 A 000224 discloses a process whereby endothermic heating is secured by the metal laminae consisting of two continuous bands of copper or another material that alternate on the two surfaces of prepreg of the packages placed in a row, and connecting said bands to a source of electric current.

According to these disclosures, having inserted the pile of packages in the press or autoclave, the ends of the metal elements in the packages must be connected to the source of electric current.

Said connections must of course be made allowing for the characteristics of the elements to be connected.

As the case may be, said elements can be the metal laminae in the packages, the metal band or bands laid serpentinewise that form said laminae, the sheets of steel placed at the top and bottom of packages, or others. As the forms and materials of said elements are heterogeneous, as a result electric connections may be complex and require much care and in any case adequate timing and manoeuvering.

SUMMARY OF THE INVENTION

The purpose of the invention here described is to increase the advantages offered by the disclosures referred to above eliminating practically everything done by hand to form the electrical connections, such connections becoming a result of the machine's opening and closing movements as will be explained in what follows.

Subject of the invention is a method of automatic connection, during the pressing process, between a source of electric current and the metal parts connected in series, of the piles of packages to make plastic laminates to make possible electric endothermic heating. At the beginning and end of a pile of packages, the two extremities of the metal parts connected in series have areas of electric contact consisting of a flat open surface of said metal parts substantially orthogonal to the axis of the pile.

At those parts of the pressing machines, that create pressure for pressing, which come in contact with the two ends of the pile respectively, there is a high conductivity lamina, of copper or another metal, separated from the rest of the machine by some means of insulation.

The two laminae are connected by wiring to the source of electric energy so that, when the pile is placed in the machine, one of said two laminae in the machine comes in contact with one of the electric contact areas in the pile.

During pressing, on account of the machine being closed, the second contact lamina in the machine comes in contact with the second area of electric contact in the pile; this closes the electric circuit among the metal parts connected in series in the pile and the source of electricity. If the pressing machine is a press, the pressing machine's two contact laminae are fixed respectively to the two pressure plates that are contraposed one to another to create pressing pressure in the pile of packages placed between them.

Therefore, when the press is closed, pressure is applied, simultaneously with closure of the electric circuit, which produces electric endothermic heating of the packages in the pile.

If the pressing machine is an autoclave the pressing machine's two contact laminae are fixed respectively to the bottom of the autoclave's chamber and to a door in said autoclave which is substantially parallel to the bottom. Therefore, when the autoclave is closed, this also closes the electric circuit and produces electric endothermic heating of the packages in the pile.

The contact lamina is fixed to the door of the autoclave by elastic means such as springs, bearings and the like placed between said door and said lamina or between said door and insulating and supporting plates and the like. Closing of the door sets up tension in said elastic means ensuring optimum contact pressure between said contact lamina and the area of electric contact in the pile. In one pile, the area of electric contact at the beginning and end are the the extremities themselves of the serpentinewise metal band which creates the laminates of the metal laminae. In another pile, the two metal bands in the serpentinewise multi-composition band that form the packages of laminates, are connected together in each of the two ends by electric wiring. The areas of electric contact at the beginning and end of the piles are the extremities of one of said metal bands, or of the metal band if the multi-composition band comprises only one metal band.

In a further pile, the areas of electric contact at the beginning and end of the pile are the metal laminae comprised in the packages to make plastic laminates connected in series and which lie at the beginning and end of the pile.

In a further pile formed, the areas of electric contact at the beginning and end of the pile are one of the two metal sheets placed between the packages at the beginning and end of the pile and connected in series.

In still a further pile, the areas of electric contact at the beginning and end of the pile are the ends of lengths of electricity-conducting material that, serpentinewise, connect pairs of metal sheets among the packages with others placed at the beginning and end of the pile.

In another pile, the ends of the two metal bands that form the laminae of the plastic laminates are connected one to another by electric wiring, and in said pile the areas of electric contact at the beginning and end are the extremities of one of said metal bands.

The advantages of the invention are evident. To ensure a supply of electric current to the piles of packages to make plastic laminates, it is enough to place said piles in pressing machines, such as presses and autoclaves, provided with the devices subject to the present invention. Since closure of the machines, done substantially in accordance with known methods, simultaneously closes the electric circuit and executes the normal pressing process, plastic laminates are produced with greater simplicity and speed, reducing the number of operators, raising output and lowering costs as a result.

DESCRIPTION OF PREFERRED EMBODIMENTS

Figure 1:
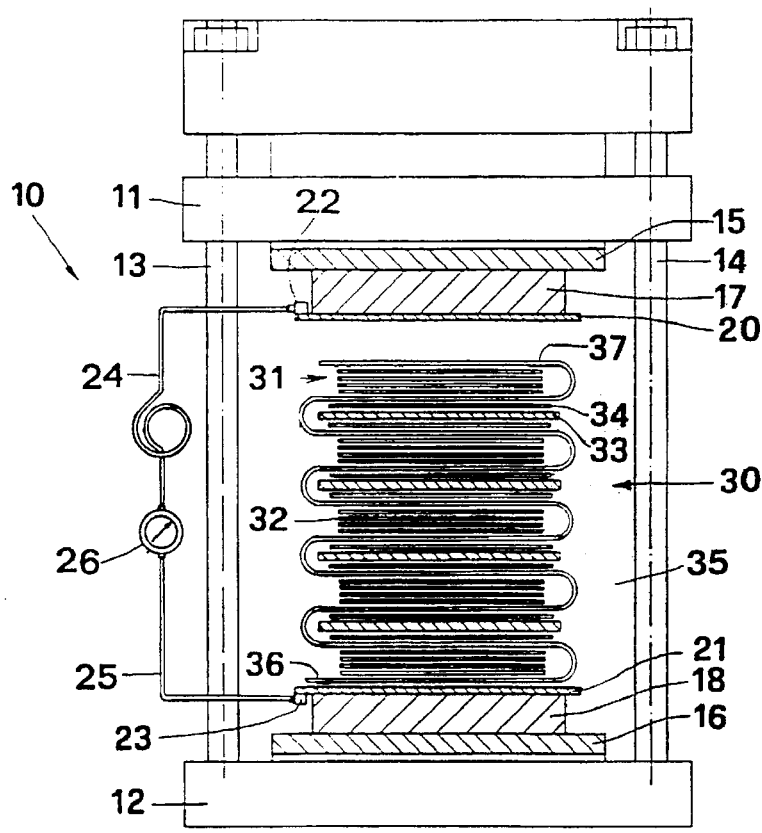
FIG. 1 Cold press open, showing a pile of packages for making plastic laminates, with metal laminae made from a continuous band.

The press 10 (FIG. 1) comprises the plates 11 and 12 connected by the columns 13, 14, pressure being generated between said plates.

Placed on the opposing faces of said plates are insulating sheets 15 and 16 and metal sheets 17 and 18.

To these latter are respectively fixed copper sheets 20 and 21 connected by terminals 22 and 23 and wires 24 and 25 to the source of electric current 26.

The wire 25 is rigid while the wire 24 is flexible.

Electric power is sufficient to ensure enough endothermic heating for the process of pressing the packages to make plastic laminates.

In said press is placed a pile 30 of packages 31 of laminates. Which packages 31 consist of layers of prepreg 32 with sheets of steel 33 between them. Between the layers of prepreg and the steel sheets there is a band 35 of copper bent in the form of an S.

Between said band 35 and said sheets 33 are insulating layers 34.

The flat ends 36 and 37 of said band 35 correspond with the external surfaces of the pile 30.

One end 36 of the band 35 makes contact with the copper sheet 21 placed on the metal sheet 18 in the press 10.

Figure 2:
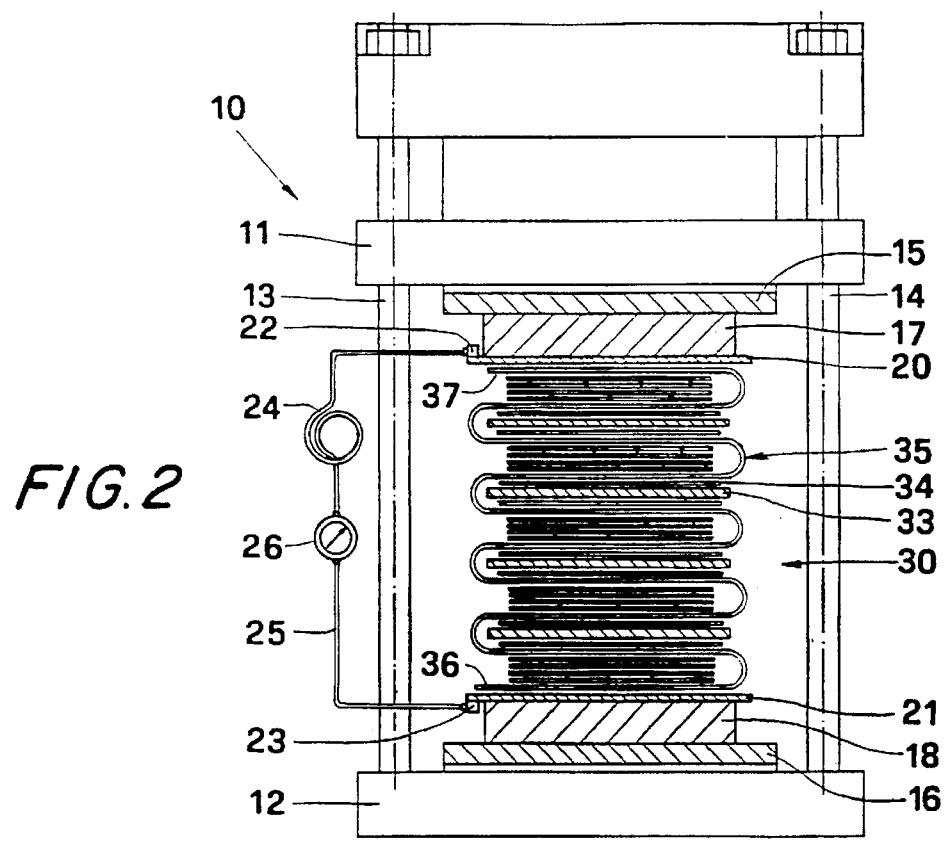
FIG. 2 The same press when closed.

On closing the press (FIG. 2) the sheet 20 fixed to the press's metal sheet 17 makes contact with the other end 37 of the band 35.

In this way the electric circuit between the source of electric current 26 and said band 35 is closed so that said band heats up like an electric heating element.

Clearly therefore, closure of the press simultaneously generates the pressure and heat needed during the pressing process.

Figure 3:
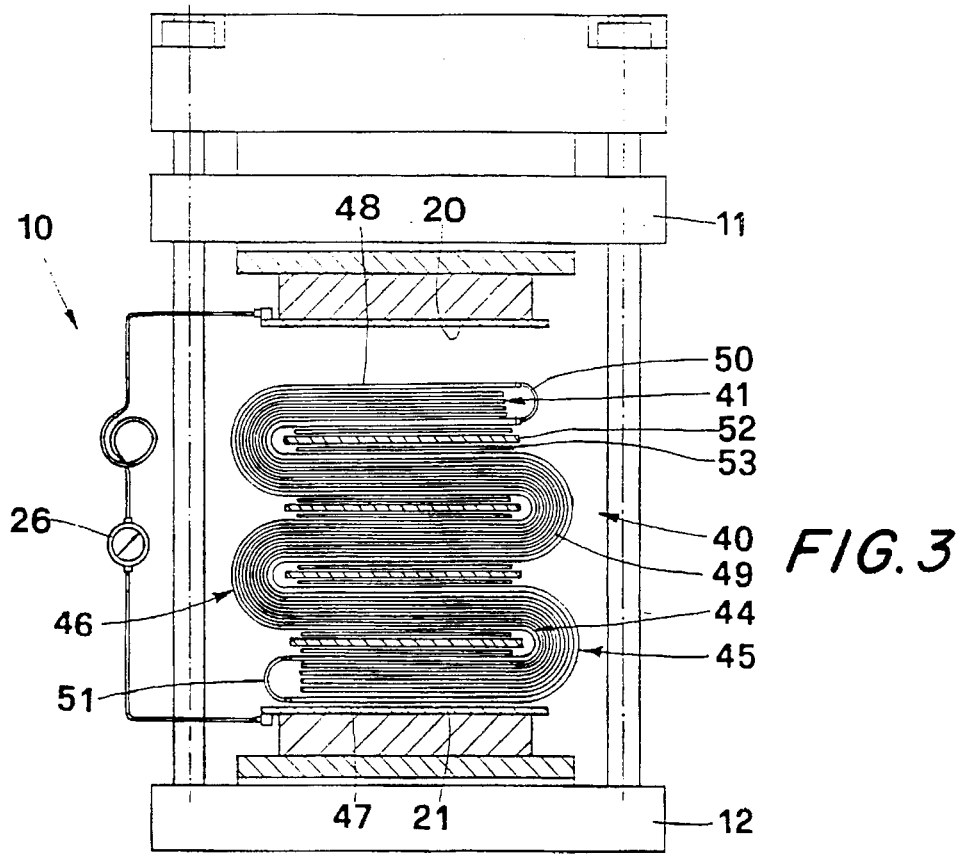
FIG. 3 Cold press open, showing a pile of packages for making plastic laminates, made from a multi-composition band.

In FIG. 3 the press 10, already described, contains a pile 40 of packages 41 to make laminates. Which packages 41 consist of multi-composition band 44 comprising sheets 49 of prepreg and external copper ones 45, 46.

Said band 44 is laid in the form of an S alternatively round the steel sheets 52 with insulating layers 53 in between.

The two lower and upper ends of the copper sheets 45, 46 are respectively connected to the wires 50, 51.

The lower end 47 of the first band 45 makes contact with the lower contact sheet 21 of the press 10.

Figure 4:
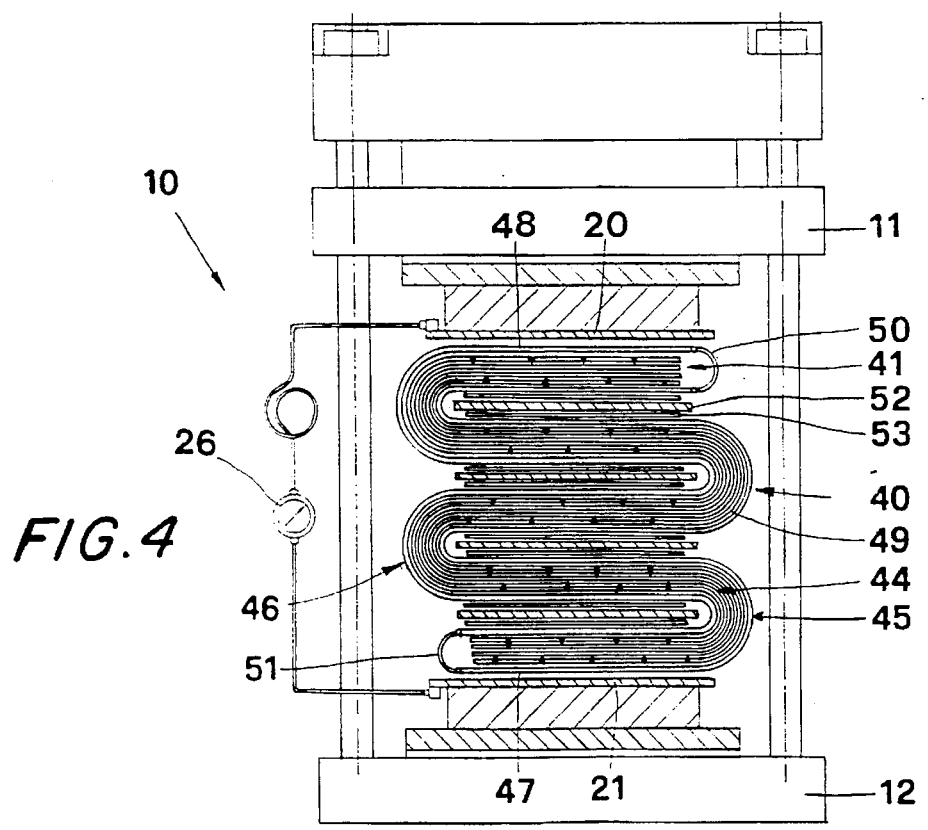
FIG. 4 The press in FIG. 3 when closed.
Figure 5:
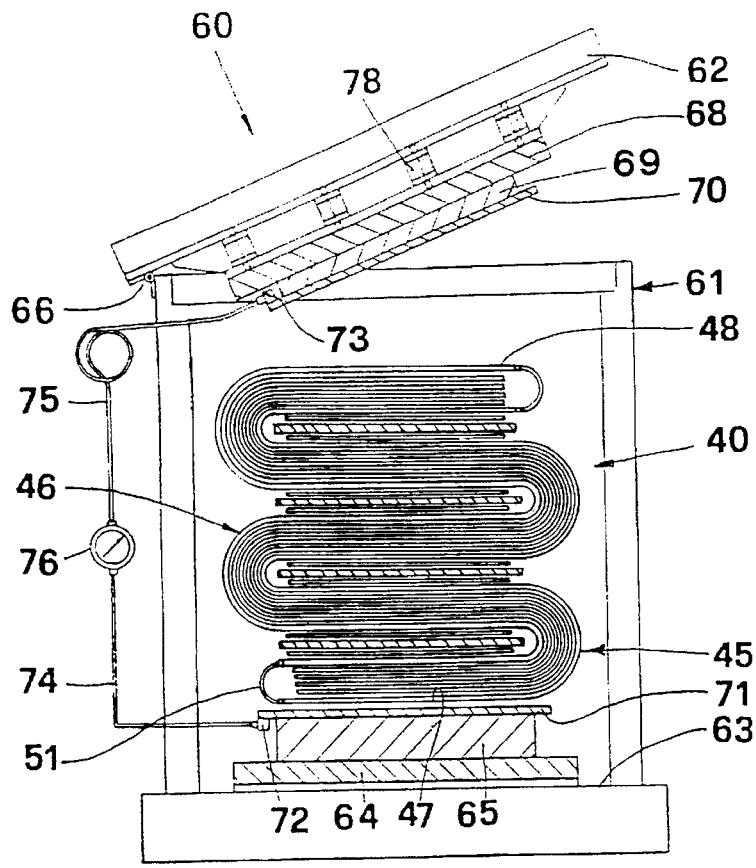
FIG. 5 Autoclave open showing a pile of packages like those in FIGS. 3 and 4.

On closing the press (FIG. 4), the press's upper contact sheet 20 will make contact with the upper end 48 of the second band 46. The electric circuit between said bands 45, 46 and the source of electricity 26 is thus closed. It is therefore clear that closure of the press generates simultaneously pressure and heat during pressing. The autoclave 60 (FIG. 5) comprises the casing 61 and lid 62 joined to the casing by the hinge 66.

On the bottom 63 of the autoclave is a plate 64 of insulating material that sustains the bottom sheet 65.

On the inside of the lid 62, elastic means 78 fix the plate 68 of insulating material that carries the sheet 69. On sheets 65 and 69 are respectively fixed the copper sheets 70 and 71 connected by terminals 72, 73 and wires 74, 75 to the source of electric current 76.

Wire 74 is rigid while wire 75 is flexible.

The pile 40, already described, is placed in said autoclave. The lower end 47 of the first band 45 is in contact with the autoclave's lower contact sheet 70.

Figure 6:
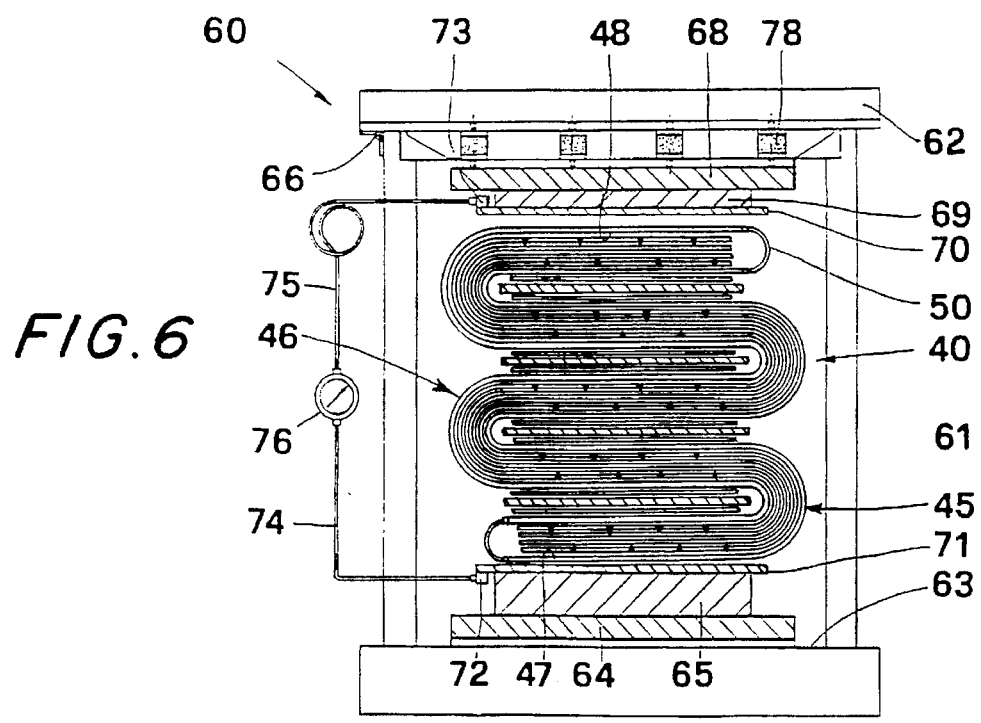
FIG. 6 The autoclave seen in FIG. 5, when closed.
Figure 7:
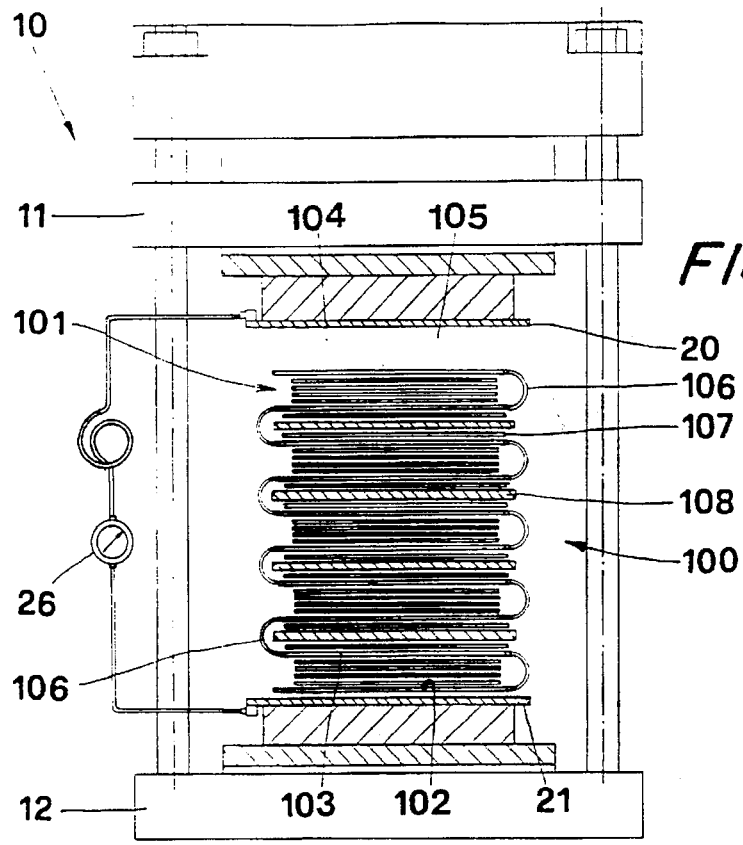
FIG. 7 Cold press open, showing a pile of packages whose metal laminae are connected in series.

On closing the lid 62 (FIG. 6), the autoclave's upper contact sheet 71 comes in contact with the upper end 48 of the second band 46. The electric circuit between said bands 45, 46 and the source of current 26 is thus closed. It is therefore clear that closure of the autoclave determines simultaneous operation of the autoclave 60 and generation of heat for carrying out the pressing process. FIG. 7 illustrates the press 10, already described, containing a pile 100 of packages 101 to make laminates.

The copper laminae, 102, 103, 104, 105 in said packages are connected S-wise in series by electric wiring 106.

Insulating sheets 107 are laid between the laminae 102–105 and the sheets of steel 108.

The first lamina 102 starting the pile 100 is in contact with the lower contact sheet 21 of the press 10.

Figure 8:
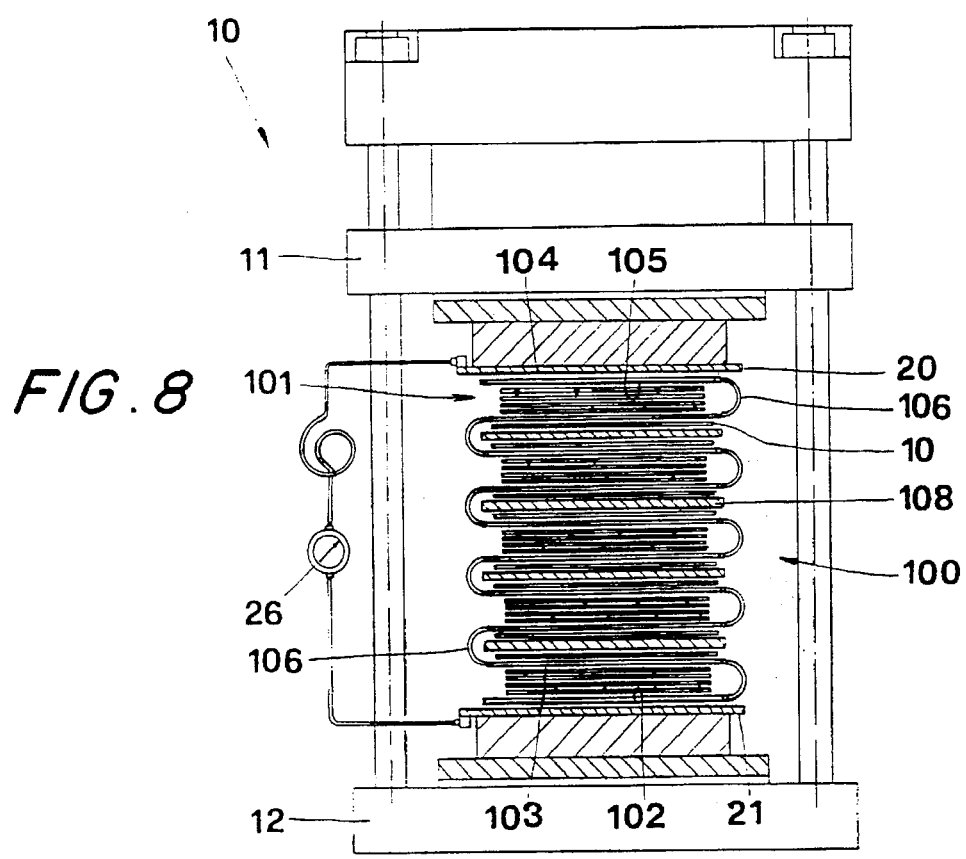
FIG. 8 The press in FIG. 7 when closed.

On closing the press (FIG. 8) the press's upper contact sheet 20 comes in contact with the upper lamina 105 ending the pile 100. This therefore closes the electric circuit between the set of laminae 102–105 in the packages 101 and the source 26 of electric current.

It is thus clear that closure of the press causes simultaneous generation of pressure and heat needed for the pressing process.

Figure 9:
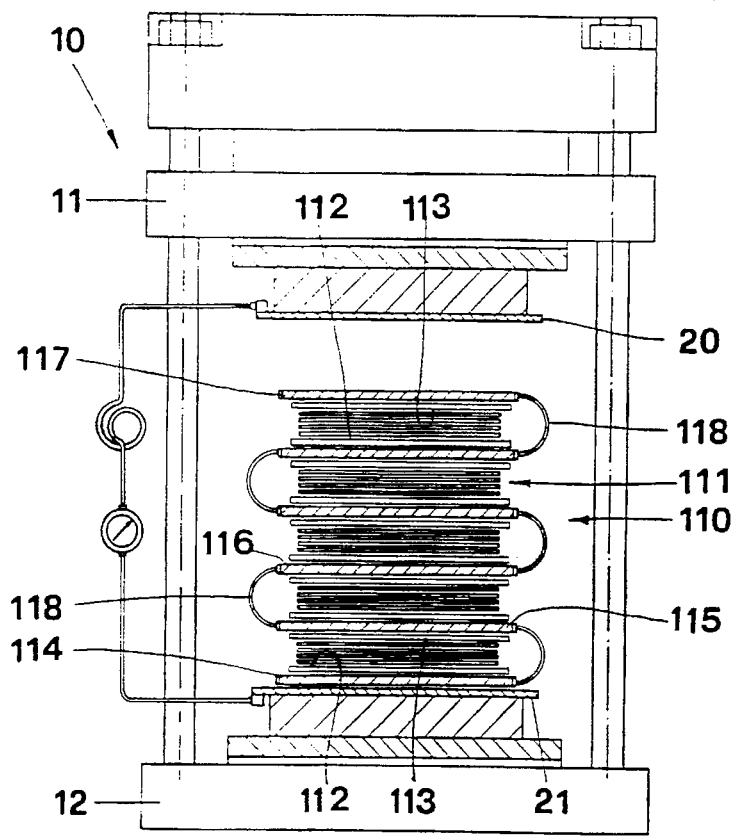
FIG. 9 Cold press open, showing a pile of packages whose metal sheets, placed between one package and another, are connected in series.

In FIG. 9 the press 10, already described, contains a pile 110 of packages 111 to make laminates and comprising the lower 112 and upper 113 laminae.

The steel sheets, like 114–117, are connected S-wise in series by the electric wires 118.

The first steel sheet 114 at the bottom of the pile 110 is in contact with the lower contact sheet 21 of the press 10.

Figure 10:
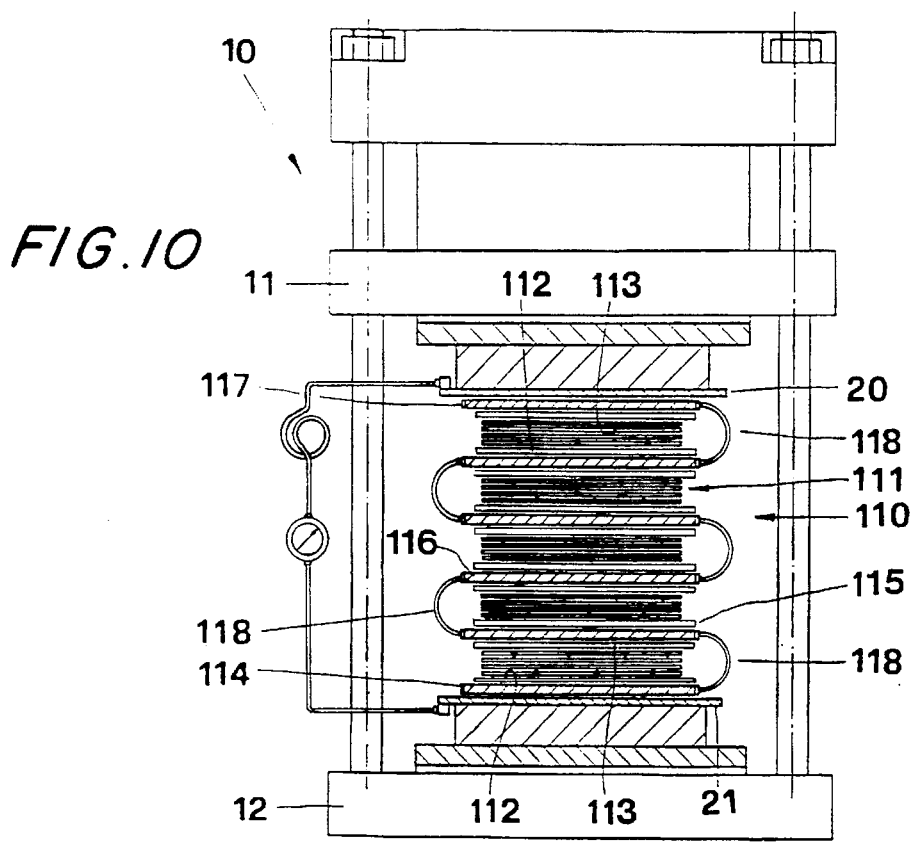
FIG. 10 The press in FIG. 9 when closed.
Figure 11:
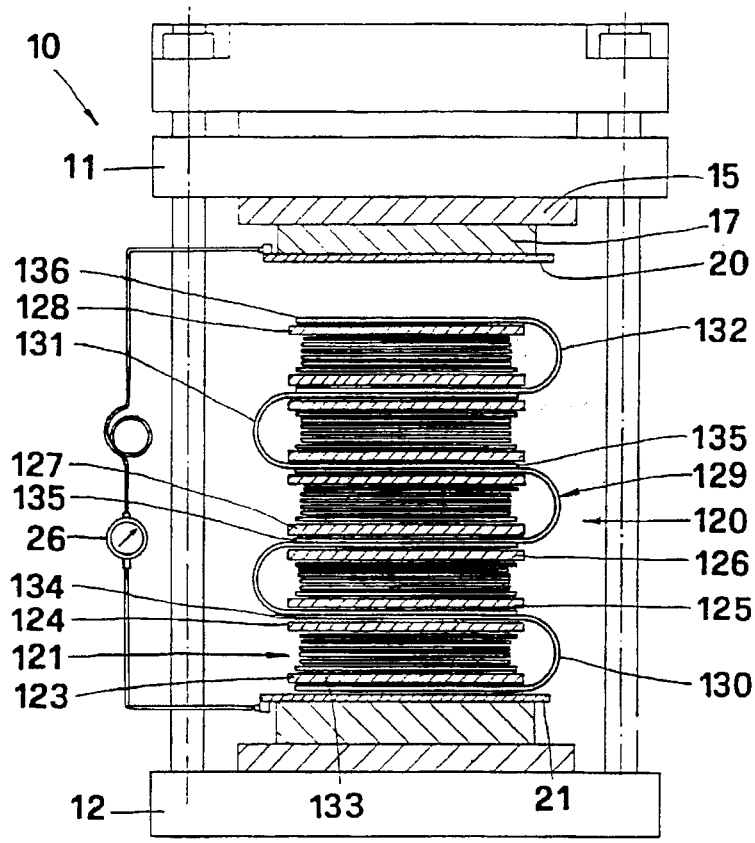
FIG. 11 Cold press open showing a pile of packages with electric heating elements made by connecting pairs of sheets between the packages by means of lengths of electric wiring laid serpentinewise between one pair and the next.

On closing the press (FIG. 10) the press's upper contact sheet 20 comes in contact with upper sheet 117 of the pile 110. This closes the electric circuit between the set of steel sheets in the package and the source of electricity. FIG. 11 shows a pile 120 of packages 121 to make laminates, formed according to another variant, in the press 10.

Steel sheets 124, 125 and 126, 127 are placed in pairs between one package and another.

Said pairs are connected in series by a multicomposition band 129 laid serpentinewise and formed of a number of U-bent sections 130, 131, 132 whose ends, like 134, 135, are fitted in between the pairs of steel sheets that precede and follow the packages 121.

The band sections 130 and 132 respectively have ends 133 and 136 at the beginning and end of the pile 120 matching with the initial sheet 123 and final sheet 128.

The end 133 at the beginning of the pile is in contact with the sheet 21 at the base of the press 10.

Figure 12:
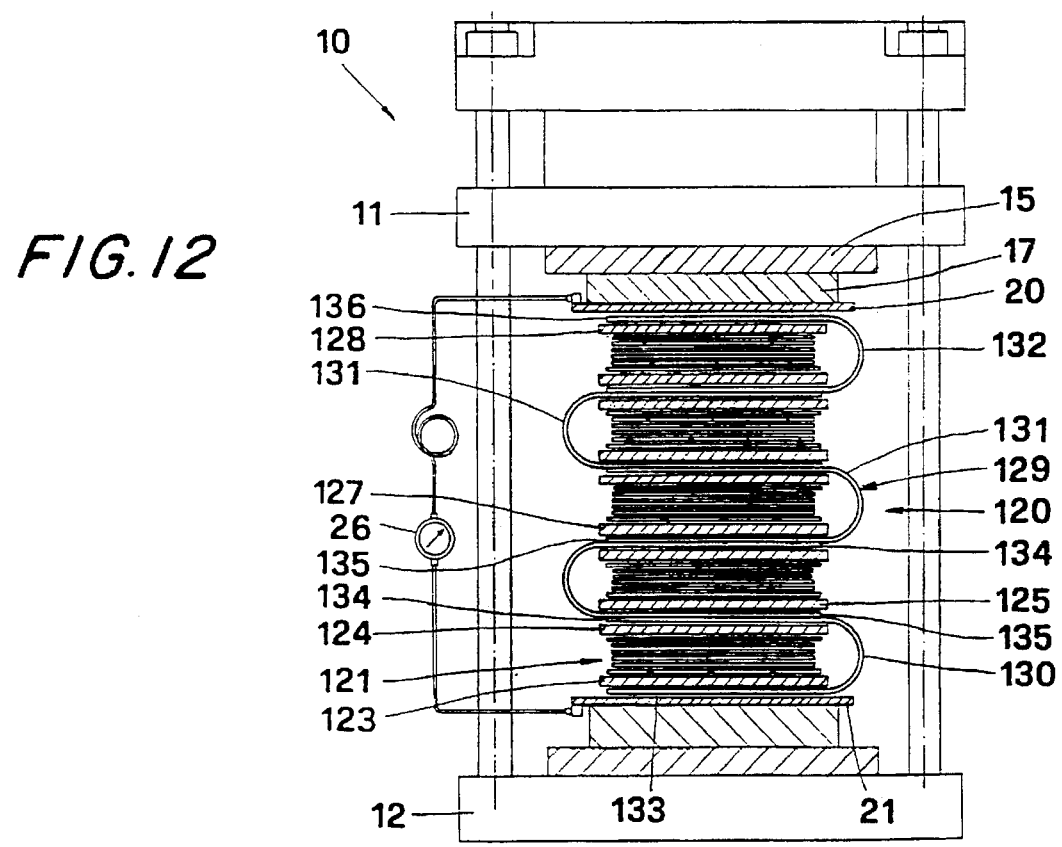
FIG. 12 The press in FIG. 11 when closed.
Figure 13:
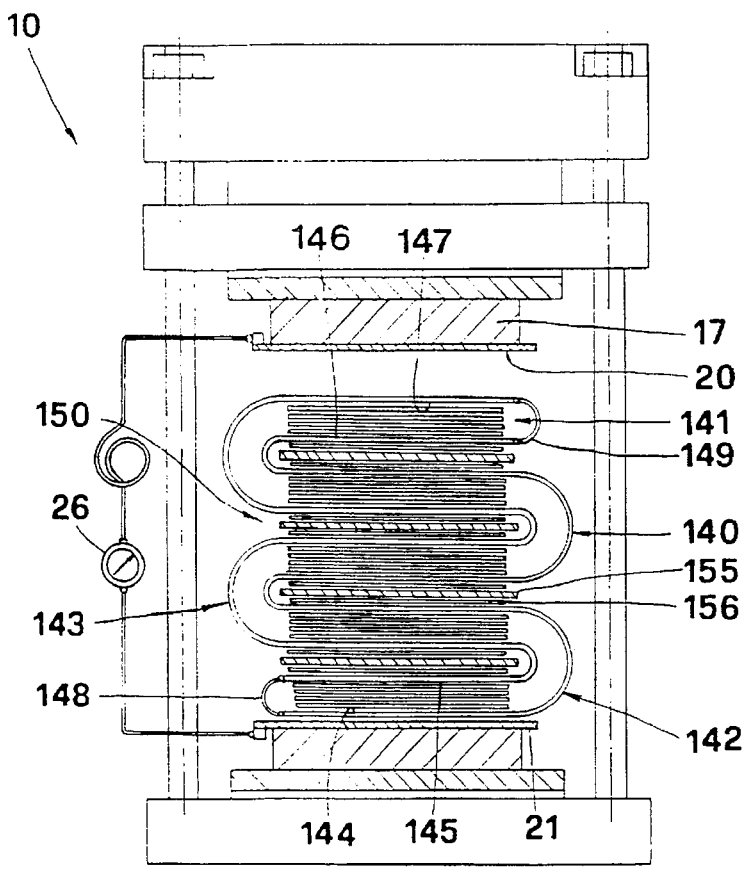
FIG. 13 Cold press open showing a pile of packages whose metal laminae are made from two continuous bands.

On closing the press (FIG. 12) the end 136 at conclusion of the pile is in contact with the sheet 20 fixed to the pressure plate 17. The electric circuit between multicomposition band 129 and the source 26 of electricity is thus closed. In FIG. 13 the press 10 contains a pile 140 of packages for laminates whose laminae are formed of two bands 142, 143 laid serpentinewise. The lower ends 144, 145 of the two bands are connected to the wire 148 while the upper ends 146, 147 are connected to the wire 149.

The end 44 of the band 142 starts the pile 40 while the end 147 of the band 143 is at the end of said pile.

Figure 14:
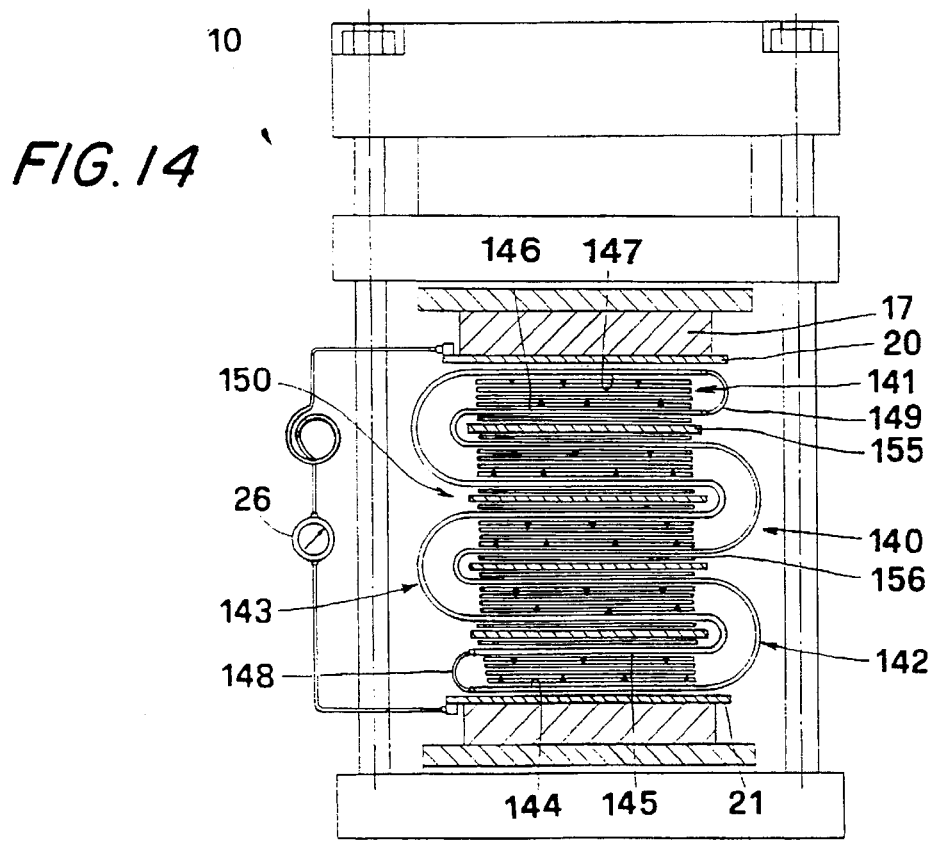
FIG. 14 The press in FIG. 13 when closed.

The end 144 thus matches with the press's lower sheet 21. When the press closes, the sheet 20 fixed to the plate 17 comes in contact with the end 147 of the pile (FIG. 14). This brings about closure of the electric circuit between the bands 142 and 143 and the source 26 of electric current so that the pressure process is started due to the simultaneous effects of pressure and heat.

I claim:

1. Process for automatic connection, when pressing takes place, between a source of electric current and metal parts, connected in series, of piles of packages to make plastic laminates to permit electric endothermic heating, characterized in that the metal parts, connected in series, have at two opening and closing ends of a pile of packages electric contact areas consisting of a flat and exposed surface of said metal parts substantially orthogonal to an axis of said pile, and in that pressing machines that produce pressure necessary for connection have, at the position of the parts that will come in respective contact with the two ends of the pile, a contact sheet of copper or of another highly conducting material, separated from other parts of the machine by layers or other insulating means, the two contact sheets being connected by wiring to the source of electric energy so that, having put the pile into the machine, one of the two contact sheets comes in contact with one end of the pile, and in that, when pressing is being done, due to closing of the machine, contact is made between the second contact sheet of the machine and the second end of the pile thus causing closure of an electric circuit among the metal parts connected in series in said pile and the source of electric current.

2. Process as in claim 1, characterized in that the two contact sheets in the pressing machine are fixed respectively to two plates placed opposite one another in the press to create pressure for the pressing process on the pile of packages placed between them, so that when the press is closed, application of pressure is accompanied by closure of an electric circuit producing endothermic heat in the packages in the pile.

3. Process as in claim 1, characterized in that the two contact sheets in the pressing machine are fixed respectively to the bottom of the chamber of an autoclave and to a lid on said autoclave which lies substantially parallel to the bottom so that closure of the lid of the autoclave both closes the electric circuit and produces electric endothermic heating of the packages in the pile.

4. Process as in claim 3, characterized in that the contact sheet is held to the lid of the autoclave by elastic means placed between said lid and said contact sheet or else between said lid and insulating and supporting plates, closing of the lid setting up tension in them and ensuring optimum contact pressure between said contact sheet and an area of electric contact in the pile.

5. Process as in claim 1, characterized in that, in the pile the areas of electric contact at a beginning and end are ends of a metal band laid serpentenwise which form metal laminae of metal/plastic.

6. Process as in claim 1, characterized in that, in the pile the two metal parts are bands comprised in a multicomposition band laid serpentenwise and which give rise to the packages of laminates, are connected one to another in each of the two ends by wiring and in that areas of electric contact that begin and terminate the pile are the ends of one of said metal bands or of the metal band if the multicomposition band has only one metal band.

7. Process as in claim 1, characterized in that, in the pile areas of electric contact at the beginning and end of the pile are the metal laminae comprised in the packages for plastic laminates connected in series and that are placed at the beginning and end of the pile.

8. Process as in claim 1, characterized in that, in the pile the areas of electric contact at a beginning and end of the pile are two of the metal sheets placed both between the packages and also at the beginning and end of the pile and connected in series.

9. Process as in claim 1, characterized in that, in the pile areas of electric contact at a start and finish of the pile are ends of two lengths of electric conducting material that connect, serpentenwise, the metal sheets put between the packages and also at the beginning and end of the pile.

10. Process as in claim 1, characterized in that, in the pile, ends of two metal bands which comprise metal laminae of metal/plastic laminates, are connected one to another by electric wiring and in that, in said pile, areas of electric contact at a start and finish are ends of said metal bands.

* * * * *